US012776760B2

(12) United States Patent
Berkol et al.

(10) Patent No.: US 12,776,760 B2
(45) Date of Patent: Oct. 27, 2026

(54) FLOATING HIGH-VOLTAGE SWITCH WITH OPEN-LOOP IMPEDANCE CONTROL

(71) Applicant: Analog Devices International Unlimited Company, Limerick (IE)

(72) Inventors: Gönenç Berkol, Limerick (IE); Devrim Yilmaz Aksin, Wilmington, MA (US); Brian D. Hamilton, Wilmington, MA (US)

(73) Assignee: Analog Devices International Unlimited Company, Limerick (IE)

( * ) Notice: Subject to any disclaimer, the term of this patent is extended or adjusted under 35 U.S.C. 154(b) by 11 days.

(21) Appl. No.: 18/801,862

(22) Filed: Aug. 13, 2024

(65) Prior Publication Data

US 2026/0051875 A1 Feb. 19, 2026

(51) Int. Cl.
*H03K 3/011* (2006.01)
*H03K 17/687* (2006.01)

(52) U.S. Cl.
CPC ........... *H03K 3/011* (2013.01); *H03K 17/687* (2013.01)

(58) Field of Classification Search
CPC ............................. H03K 3/011; H03K 17/687
USPC .......................................................... 327/109
See application file for complete search history.

(56) References Cited

U.S. PATENT DOCUMENTS 6,157,244 A * 12/2000 Lee ......................... G01K 7/01 327/539
11,431,334 B2 8/2022 Dempsey et al.
11,671,094 B1 * 6/2023 Shinde ............ H03K 19/00361 327/109
2016/0179113 A1 * 6/2016 Taigor .................... G11C 16/06 327/513

FOREIGN PATENT DOCUMENTS

EP 3121964 A1 1/2017
EP 4202592 A1 6/2023

OTHER PUBLICATIONS

International Search Report and Written Opinion received for PCT Patent Application No. PCT/EP2025/072865, mailed on Nov. 5, 2025, 13 pages.

* cited by examiner

*Primary Examiner* — Regis J Betsch
*Assistant Examiner* — Amit R Bhatia
(74) *Attorney, Agent, or Firm* — ArentFox Schiff LLP

(57) ABSTRACT

High-voltage (HV) semiconductor switches are used in various applications. On-impedance (Ron) of the HV switches is prone to process, voltage, and temperature (PVT) variations. The present invention discloses system and method embodiments to calibrate a gate-to-source voltage (Vgs) of the switch based on a low temperature coefficient resistor and current references. The Ron of a replica switch transistor is matched to a reference resistor using a feedback to generate the required Vgs voltage. The calibrated Vgs is enforced to the floating HV switch transistor via controlling the bias current of a replica gate driver by feedback. With this approach, a desired input current to the gate driver may be obtained and applied to a main gate driver to control the Ron of the floating HV switches. Simulation results demonstrate a significant improvement in Ron variation.

20 Claims, 10 Drawing Sheets

$I_{VGS}$ Generator

$I_{VGS}$ Generator

FLOATING HIGH-VOLTAGE SWITCH WITH OPEN-LOOP IMPEDANCE CONTROL

BACKGROUND

A. Technical Field

The present disclosure relates generally to semiconductor switch control. More particularly, the present disclosure relates to systems and methods for controlling on-impedance (Ron) of floating high voltage (HV) switches.

B. Background

HV semiconductor switches, e.g., a bipolar junction transistor (BJT) device, metal oxide semiconductor FET (MOSFET) devices, etc., are used in various applications. One of key performance parameters of a semiconductor switch is its on-impedance (Ron). However, Ron of the HV switches is prone to process, voltage, and temperature (PVT) variations and can change in value during operation. A worst-case variation of the Ron for certain high-voltage switches might be about 50%, as shown in FIG. 1. Currently, there are very limited, if not none, available HV switch products in the industry that limit Ron variation to below 5%.

Accordingly, what is needed are systems and methods to control the on-impedance of floating HV switches, especially without limiting the bandwidth and slew-rate of the signals applied to HV switches.

BRIEF DESCRIPTION OF THE DRAWINGS

References will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments. Items in the figures are not to scale.

DETAILED DESCRIPTION OF EMBODIMENTS

Figure 1:
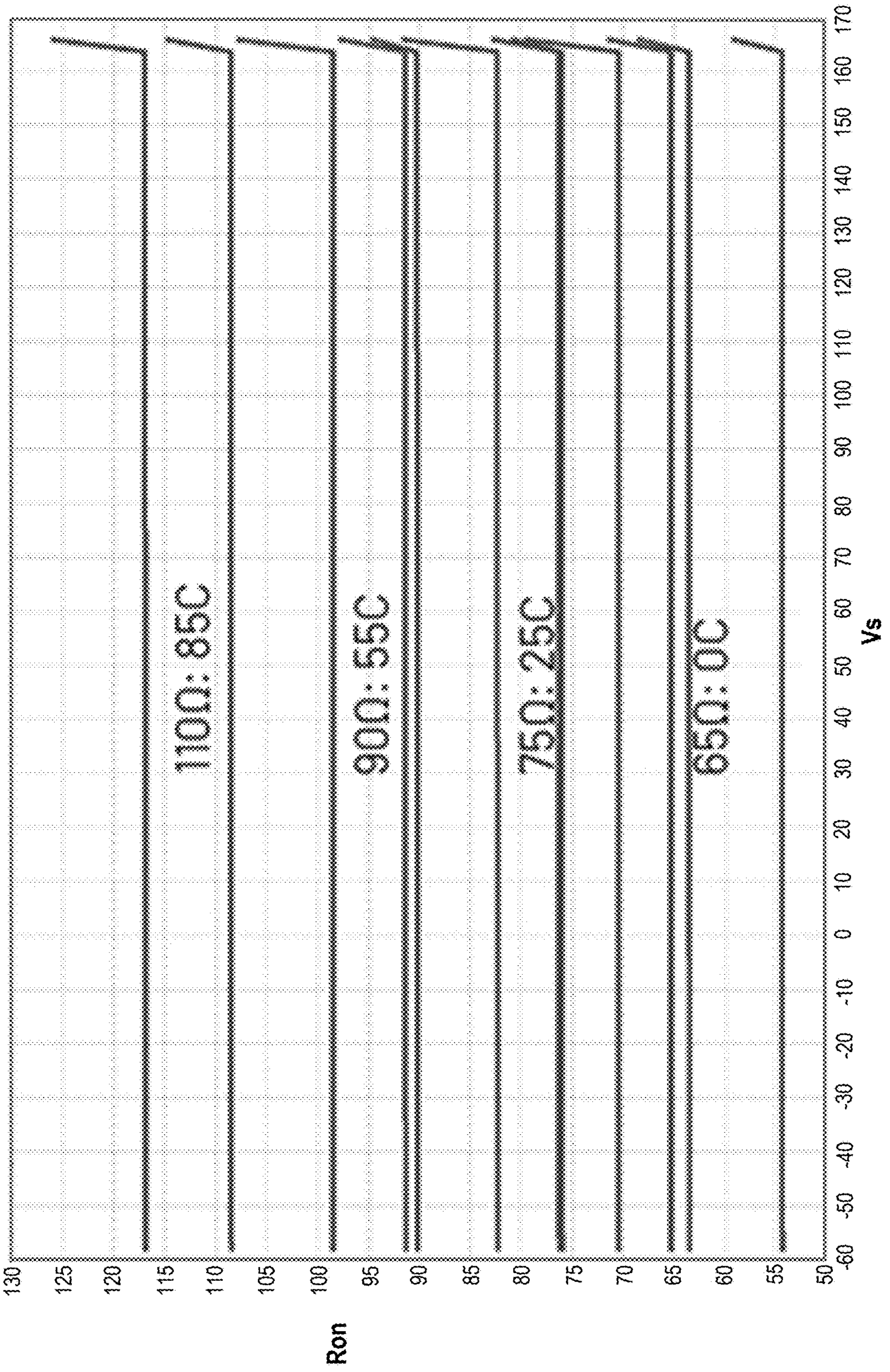
FIG. 1 (Prior Art)
FIG. 1 depicts a 100-ohm HV switch impedance simulation.

In the following description, for purposes of explanation, specific details are set forth in order to provide an understanding of the disclosure. It will be apparent, however, to one skilled in the art that the disclosure can be practiced without these details. Furthermore, one skilled in the art will recognize that embodiments of the present disclosure, described below, may be implemented in a variety of ways, such as a process, an apparatus, a system/device, or a method on a tangible computer-readable medium.

Components, or modules, shown in diagrams are illustrative of exemplary embodiments of the disclosure and are meant to avoid obscuring the disclosure. It shall be understood that throughout this discussion that components may be described as separate functional units, which may comprise sub-units, but those skilled in the art will recognize that various components, or portions thereof, may be divided into separate components or may be integrated together, including, for example, being in a single system or component. It should be noted that functions or operations discussed herein may be implemented as components. Components may be implemented in software, hardware, or a combination thereof.

Furthermore, connections between components or systems within the figures are not intended to be limited to direct connections. Rather, data between these components may be modified, re-formatted, or otherwise changed by intermediary components. Also, additional or fewer connections may be used. It shall also be noted that the terms "coupled," "connected," "communicatively coupled," "interfacing," "interface," or any of their derivatives shall be understood to include direct connections, indirect connections through one or more intermediary devices, and wireless connections. It shall also be noted that any communication, such as a signal, response, reply, acknowledgement, message, query, etc., may comprise one or more exchanges of information.

Reference in the specification to "one or more embodiments," "preferred embodiment," "an embodiment," "embodiments," or the like means that a particular feature, structure, characteristic, or function described in connection with the embodiment is included in at least one embodiment of the disclosure and may be in more than one embodiment. Also, the appearances of the above-noted phrases in various places in the specification are not necessarily all referring to the same embodiment or embodiments.

The use of certain terms in various places in the specification is for illustration and should not be construed as limiting. The terms "include," "including," "comprise," "comprising," and any of their variants shall be understood to be open terms, and any examples or lists of items are provided by way of illustration and shall not be used to limit the scope of this disclosure.

One skilled in the art shall recognize that: (1) certain steps may optionally be performed; (2) steps may not be limited to the specific order set forth herein; (3) certain steps may be performed in different orders; and (4) certain steps may be done concurrently.

Any headings used herein are for organizational purposes only and shall not be used to limit the scope of the description or the claims. Each reference/document mentioned in this patent document is incorporated by reference herein in its entirety.

A. Conventional Switches and Existing Switch Impedance Control

Figure 2:
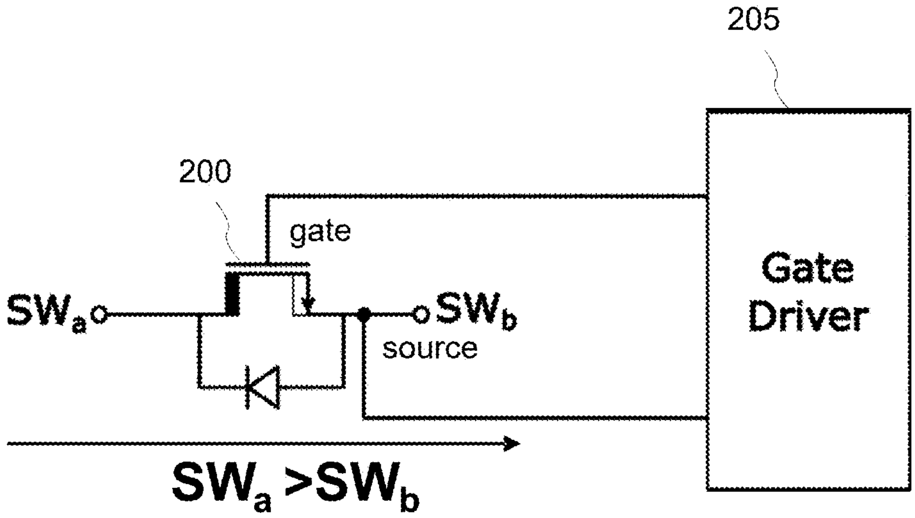
FIG. 2 (Prior Art)
FIG. 2 depicts a conventional unidirectional HV switch.

FIG. 2 shows a conventional unidirectional HV switch 200, which may be a single n-channel lateral double-diffused metal-oxide semiconductor (NLDMOS) transistor having an input node $SW_a$ and an output node $SW_b$. In typical unidirectional applications, one terminal voltage of the switch is always greater than the other (e.g., $SW_a > SW_b$), thus the current on the switch flows only in one direction. The channel length of the LDMOS transistors is typically fixed, and the source and bulk nodes are tied together. During regular operation, the parasitic diode between the source/bulk (anode) and the drain (cathode) terminals is reverse-biased.

To turn on and off the switch, a gate driver 205, generally comprising HV p-channel lateral double-diffused metal-oxide semiconductor (PLDMOS) and series of diodes, is used to control the unidirectional HV switch 200. The gate driver 205 buffers the source node ($SW_b$) and generates a voltage difference between source and gate nodes, creating a floating gate-to-source voltage (Vgs) of the switch. Conventionally, the gate-driver 205 uses a constant bias current to obtain the floating voltage Vgs. The overdrive voltage of the switch transistors ($Vgs-V_{threshold}$) has a strong dependency on variations of parameters of switch transistors and elements in the gate driver 205. The drain terminal breakdown voltage of the switch transistors sets the maximum operating voltage range of the floating HV switch.

Figure 3:
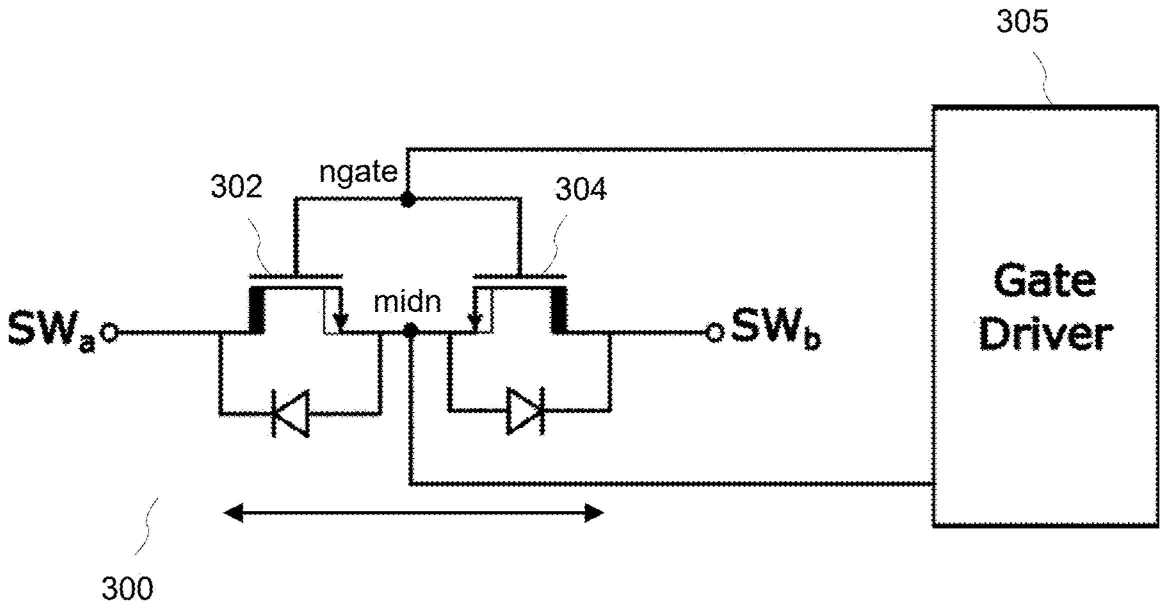
FIG. 3 (Prior Art)
FIG. 3 depicts a conventional bidirectional HV switch.

FIG. 3 shows a conventional bidirectional HV switch 300 that comprises a first NLDMOS transistor 302 and a second NLDMOS transistor 304 coupled in series back-to-back. For floating HV Switch applications, the current can flow from left to right or vice-versa, so the switch 300 is bi-directional. During regular operation, the parasitic diode between the source/bulk (anode) and the drain (cathode) terminals is reverse-biased. The input node $SW_a$ and the output node $SW_b$ of the switch can interface externally, and a large voltage difference (e.g. +/−200V) can be applied across the switch 300. When the switch 300 is off, one of the two parasitic diodes is forward biased to set the mid voltage depending on the voltage difference between the terminals. To keep the switch off, two transistors 302/304 are needed together.

To turn on and off the switch 300, a gate driver 305 is used to buffer the midn node and generate a voltage difference between midn and ngate nodes, thus creating a floating gate-to-source voltage (Vgs) of the switch 300. Similar to the gate-driver 205 for the unidirectional switch 200, the gate-driver 305 uses a constant bias current to obtain the floating voltage Vgs. The overdrive voltage of the switch transistors ($Vgs-V_{threshold}$) has a strong dependency on variations of parameters of switch transistors and elements in the gate driver 305.

Figure 4:
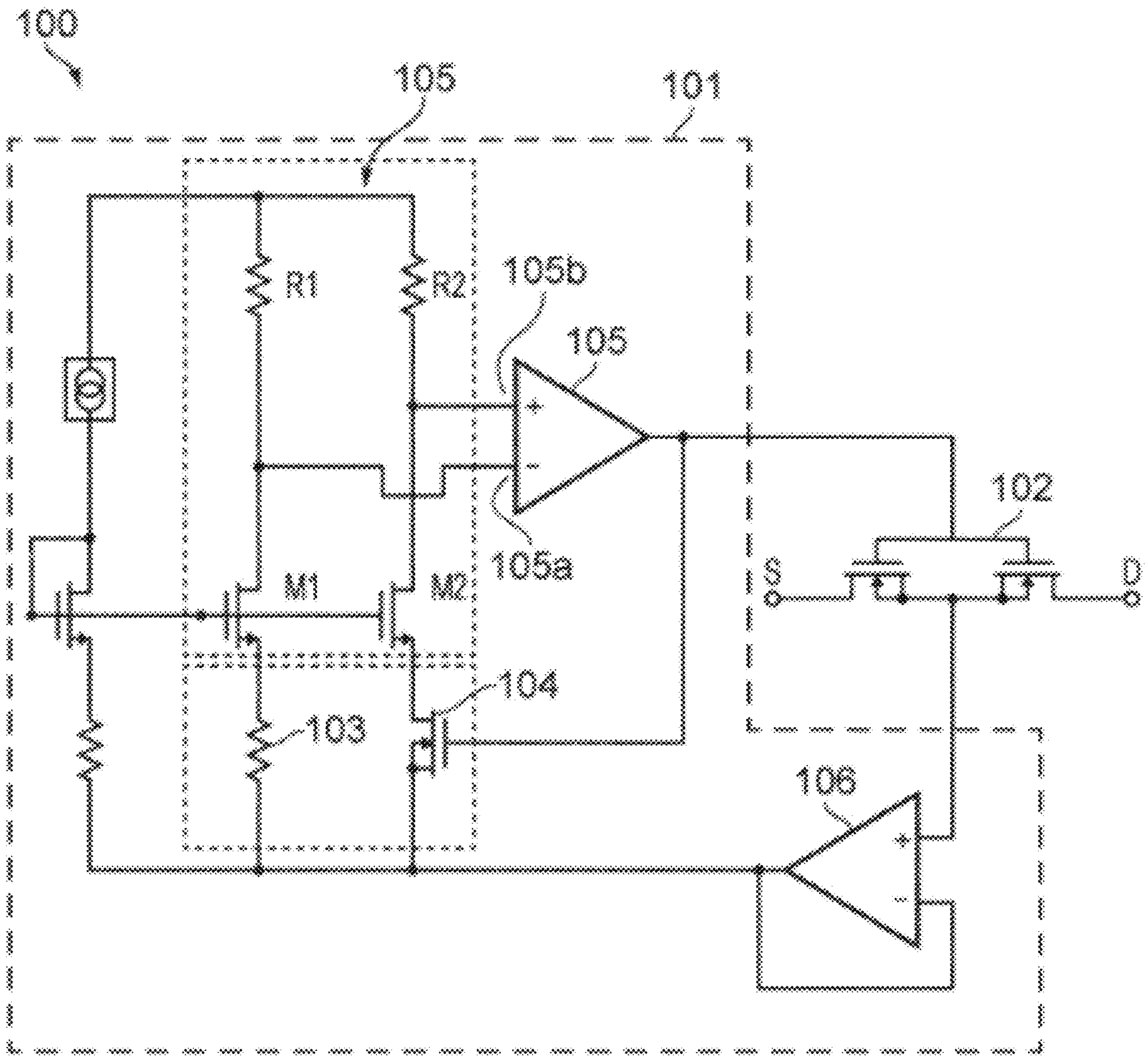
FIG. 4 (Prior Art)
FIG. 4 depicts a prior art switch control system for controlling the impedance of a bidirectional switch.

U.S. Pat. No. 11,431,334 B2 discloses a closed-loop switch control system for controlling an impedance of a switch. As shown in FIG. 4, the switch control system 100 for the bi-directional floating HV switch 102 comprises a control unit 101 that incorporates a reference load 103 having a reference impedance and a switch replica 104 substantially identical to the switch 102. The control unit 101 regulates the impedance of the switch 102 such that the impedance of the switch 102 tracks the impedance of the reference load 103. Although the switch control system 100 has advantages of DC accuracy as the feedback directly applies the required Vgs to the switch transistors, such a switch control system has challenges in aspects of speeds, area, and power. The switch control system 100 uses multiple operational amplifiers (105 (including inputs 105*a* and 105*b*)/106). Each operational amplifier (also referred to as "opamp") needs to be an HV amplifier incorporating LDMOS devices, thus occupying a large area and power consumption. To track fast transients (where the HV switch is used at several tens of MHz data rate for pin electronics applications), the opamp 106 used in the feedback loop has to be fast enough, hence increasing power consumption. Furthermore, the output signal slew-rate of such an implementation is limited by the bandwidth of the opamps.

B. Embodiments of Open-Loop Impedance Control for a Floating HV Switch

Described in this section are system and method embodiments of open-loop impedance control for floating HV switches. The implementation of these embodiments may effectively control the Ron with negligible area and power penalty without limiting the signal bandwidth and slew-rate of the HV switches.

Figure 5:
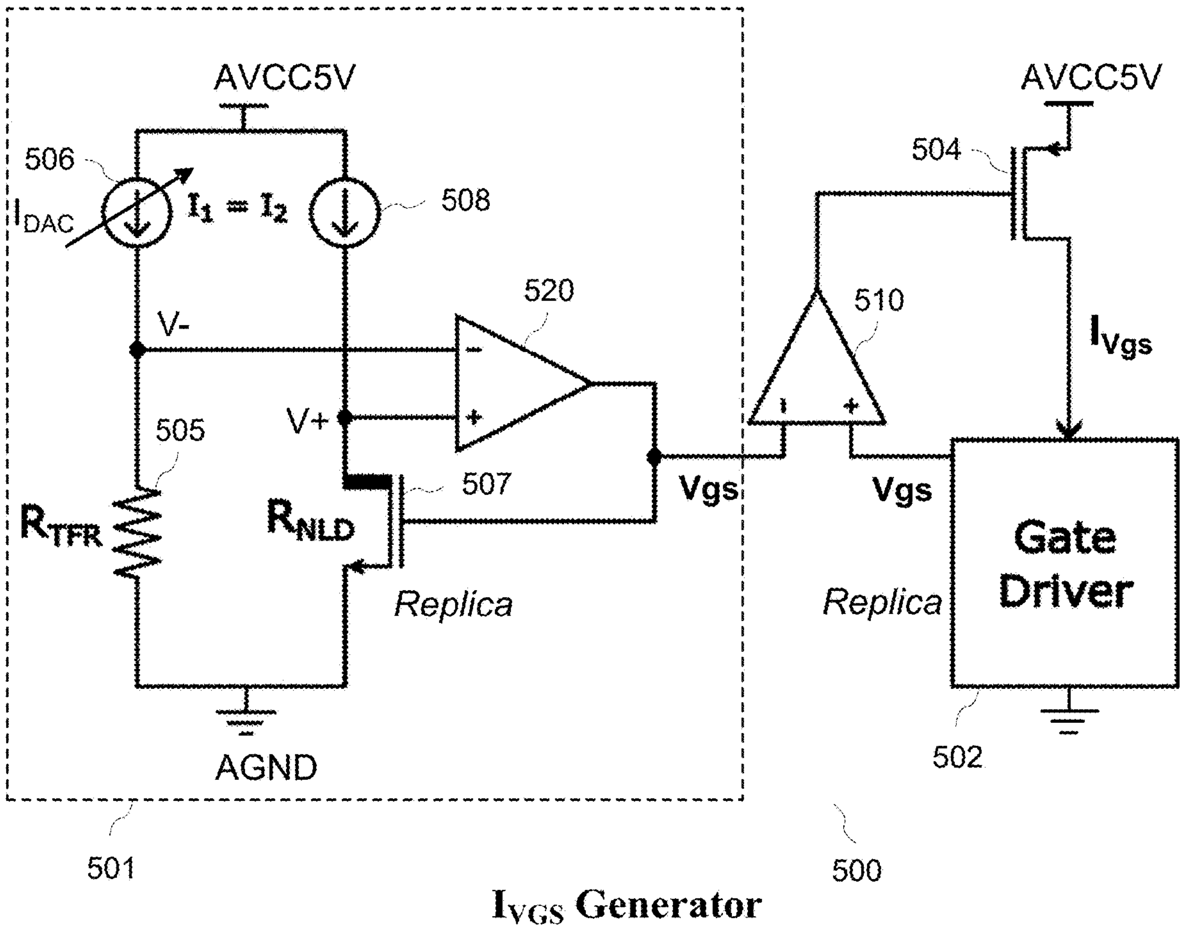
FIG. 5 depicts a schematic of calibrating a switch gate-to-source voltage (Vgs) in accordance with various embodiments of the invention.
Figure 6:
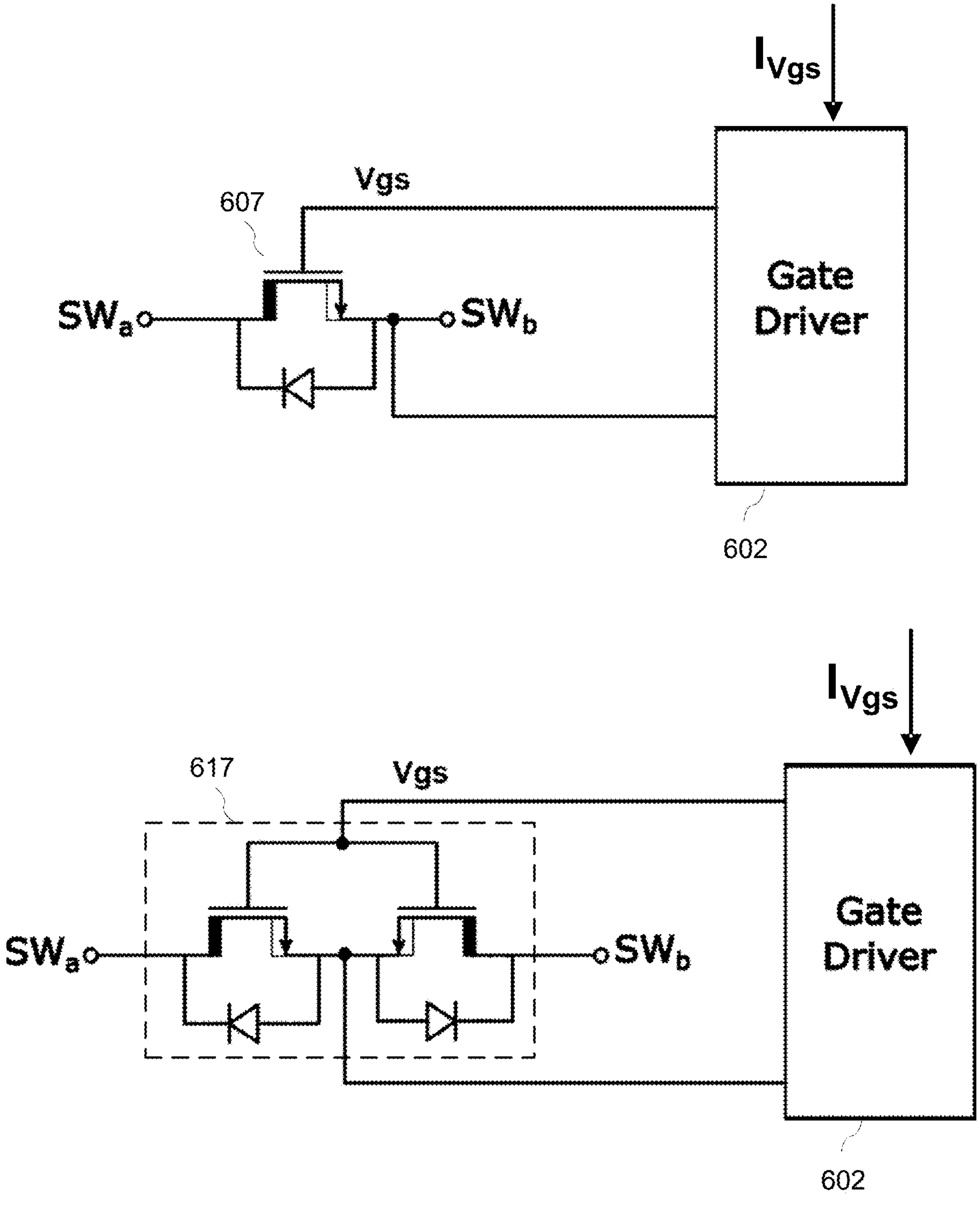
FIG. 6 depicts a schematic of enforcing calibrated Vgs to a floating HV switch for Ron control in accordance with various embodiments of the invention.

FIG. 5 depicts a schematic of calibrating a switch gate-to-source voltage (Vgs) in accordance with various embodiments of the invention. The calibration of the Vgs is based on a low temperature coefficient resistor and current references. As shown in FIG. 5, the calibration is implemented using an $I_{VGS}$ generator 500 comprising a calibration circuit 501, a replica gate driver 502 that is a duplication of a main gate driver 602 (shown in FIG. 6) driving a main floating HV switch transistor (607 or 617 as shown in FIG. 6), a first opamp 510 having a first input (e.g., a negative input) coupled to the calibration circuit 501, a second input (e.g., a positive input) coupled to the replica gate driver 502, and an output coupled back to the replica gate driver 502 via a feedback transistor 504 (e.g., a PMOS transistor).

The calibration circuit 501 comprises a calibration resistor ($R_{TFR}$) 505 having a low temperature coefficient, a replica switch 507 that is a duplication of the floating HV switch transistor, a second opamp 520 having a first input (e.g., a negative input) coupled to the calibration resistor 505, a second input (e.g., a positive input) coupled to the replica switch 507, and an output coupled to the first input of the first opamp 510 and also back to the gate terminal of the replica switch 507. The calibration circuit 501 further comprises a first current source 506 generating a first current $I_1$ flowing through the calibration resistor ($R_{TFR}$) 505 to create a voltage ($V-=I_1 \times R_{TFR}$) and a second current source 508 generating a second current $I_2$ flowing through the replica switch 507, which is designed to operate in linear-region with an on-impedance $R_{NLD}$. The calibration resistor 505 may be a thin-film-resistor (TFR) or other types of resistor that has a low temperature coefficient.

For calibration implementation, the first current source 506 is tuned to make the first current $I_1$ equal to the second current $I_2$. With the feedback path from the output of the second opamp 520 to the gate terminal of the replica switch 507, the voltage V− at the negative input is equal to the voltage V+ at the positive input of the second opamp 520 and the output of the second opamp 520 is the required Vgs to be applied to the duplicate floating HV switch for a given PVT. As a result, the on-impedance $R_{NLD}$ is equal to the resistance $R_{TFR}$ of the calibration resistor 505.

In one or more embodiments, the process variation of the $R_{TFR}$ may be calibrated by trimming the first current source ($I_{DAC}$) 506, while the second current source $I_2$ 508 is kept constant. It shall be noted that although a floating bi-directional HV switch contains two NLDMOS transistors, it is possible to use one replica NLDMOS transistor and force the on-resistance $R_{NLD}$ of the replica transistor to $R_{ON}/2$, which is half of the on-resistance of the floating bi-directional HV switch. For a unidirectional switch, $R_{NLD}$ can be made equal to $R_{ON}$. Similarly, the main HV switch transistor in 617 or 607 in FIG. 6 can be made N time copy of the replica HV switch transistor 507, resulting in an equivalent impedance of 2Ron/N or Ron/N, respectively.

For the first opamp 510, with the feedback path from the output of the opamp 510 to the replica gate driver 502, both the voltage V− at the negative input and the voltage V+ at the positive input of the first opamp 510 are equal to the voltage Vgs and the current $I_{VGS}$ is the current needed for the replica gate driver 502 to output the voltage Vgs.

FIG. 6 depicts a schematic of enforcing calibrated Vgs to a main floating HV switch for Ron control in accordance with various embodiments of the invention. As shown in FIG. 6, the calibrated current $I_{VGS}$ is applied to the gate driver 602 such that the gate driver 602 outputs the calibrated voltage Vgs to drive the main floating HV switch transistor (unidirectional switch 602 or bidirectional switch 617) and thus control the Ron of the main floating HV switch transistor.

Compared to closed-loop switch control in prior arts, the Vgs control disclosed in embodiments of the present invention is implemented via an open-loop mechanism with calibration of Vgs/$I_{VGS}$ performed in a separate circuit implemented in low-voltage domain. Such an implementation can support much faster signals as the need for high-voltage (e.g., +160V power supply voltage VHH) and high-bandwidth opamps used in the main HV switch and thus on the signal path are eliminated. Additionally, the control of switch impedance is based on a temperature-stable reference resistor ($R_{TFR}$) with programmability in a low-voltage domain (e.g., within ±5V). Therefore, accurate programming with simple current source $I_{DAC}$ may be achieved. Compared to prior art, the calibration can be made with negligible area and power penalty since the calibration is done in low-voltage domain.

Figure 7:
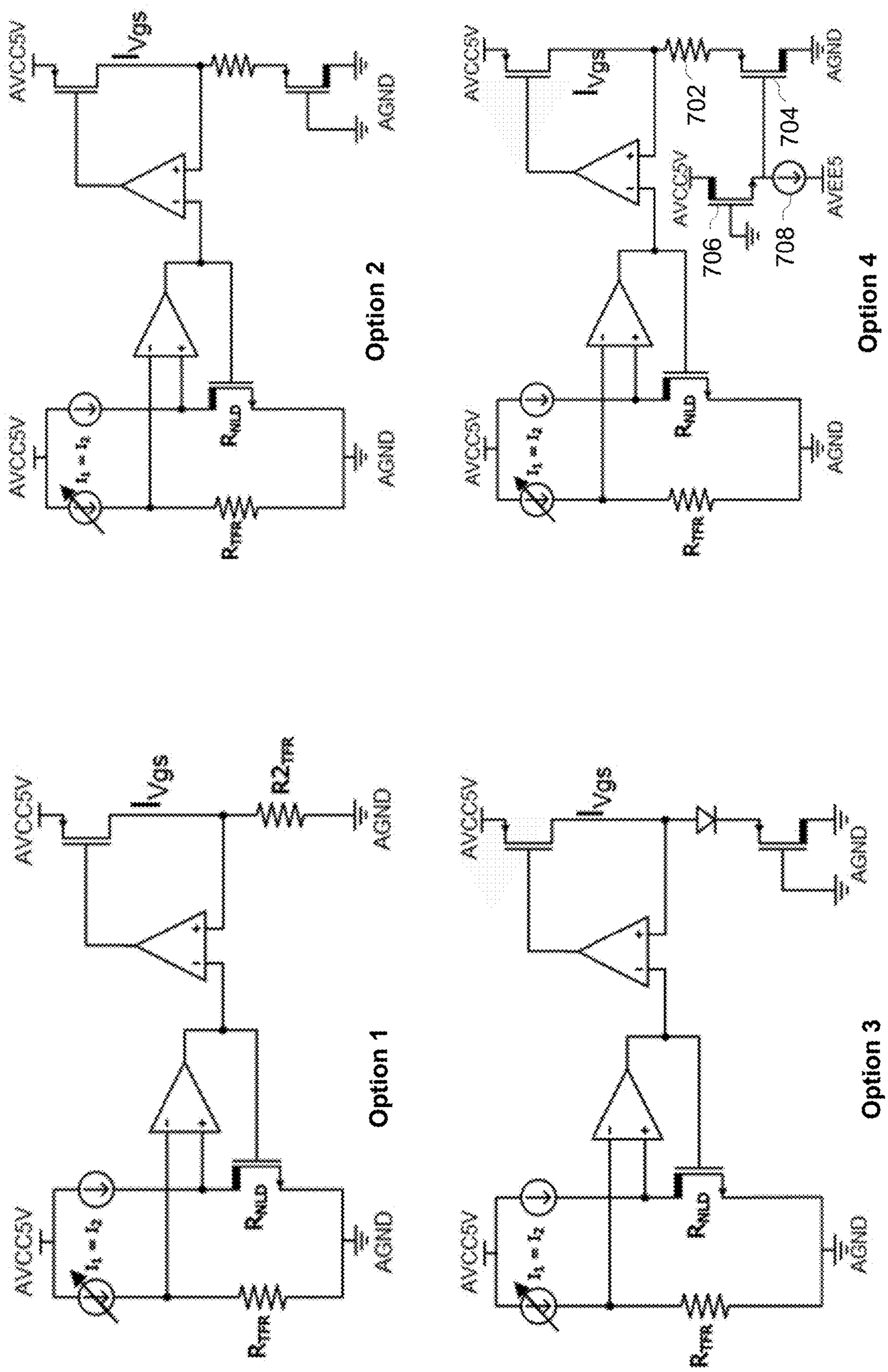
FIG. 7 depicts various gate drivers in accordance with various embodiments of the invention.

FIG. 7 depicts various gate drivers for $I_{VGS}$ generation in accordance with various embodiments of the invention. The implementation of $I_{VGS}$ generation is done is a low-voltage domain (e.g., AVCC 5V) with the gate-to-source terminal voltage limited to be lower than 5V. The gate driver may be a resistor having a low temperature coefficient (e.g., a second TFR resistor $R2_{TFR}$ as shown in option 1), a second resistor $R2_{TFR}$ in series connection with a PLDMOS transistor (as shown in option 2), a diode in series connection with a PLDMOS transistor (as shown in option 3), or a circuit comprising a first series circuit having a resistor 702 and a PLDMOS transistor 704 and a second series circuit having an NLDMOS transistor 706 and a bias current source $I_B$ 708 (as shown in option 4).

Specifically, the gate driver of option 4 may be optimized such that under all load (1 mA to 50 mA) and a common-mode range (−40V to 160V), the safe operating region of the high-voltage devices is not violated. In this option, the replica gate driver uses an additional NLDMOS transistor 706 as a source follower and is biased from the AVCC5V supply. Once the $I_{VGS}$ is calibrated, this current is copied to a gate driver of a main floating HV switch to set the on-resistance Ron of the switch to a desired value with little or without PVT sensitivity.

Figure 8:
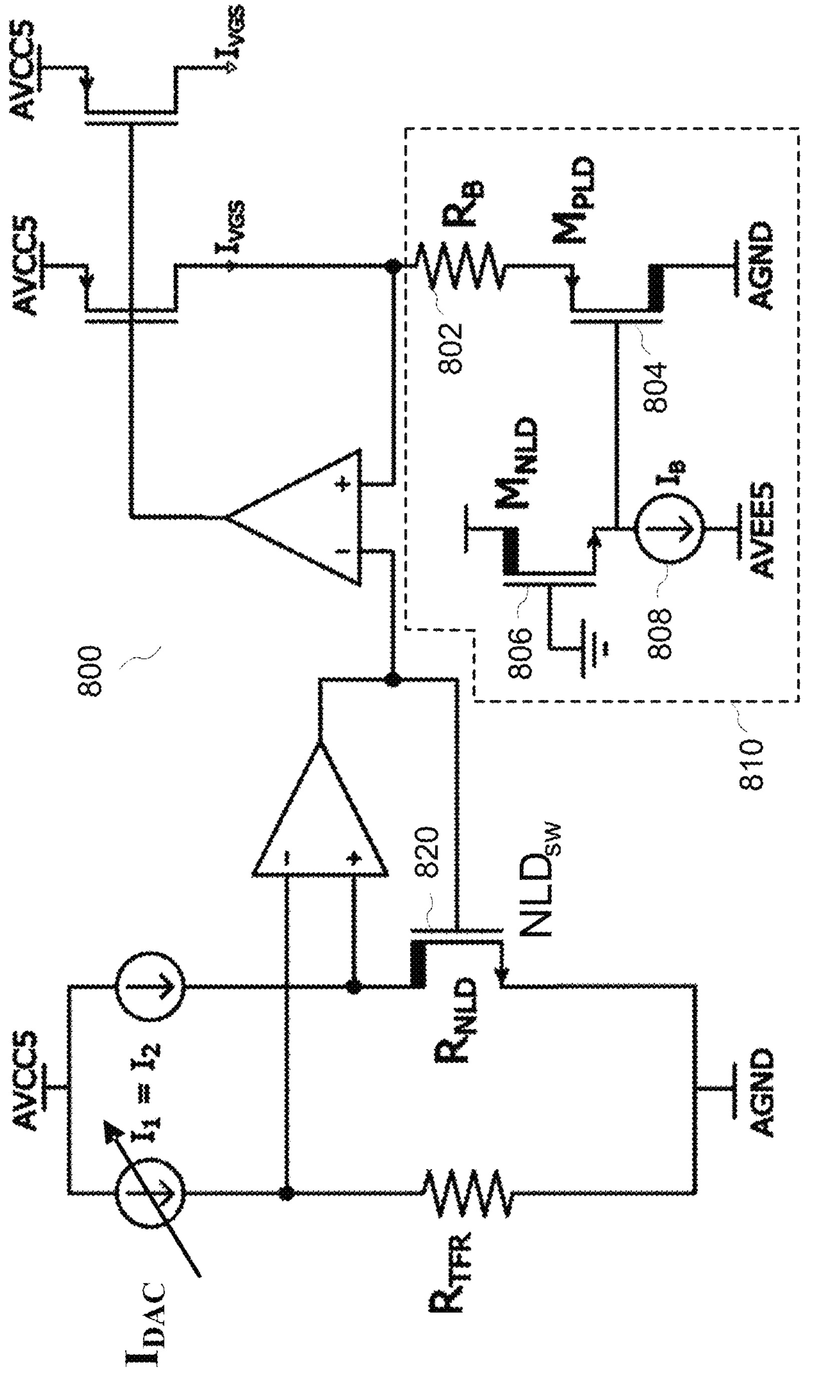
FIG. 8 depicts a full implementation of $I_{VGS}$ generation in accordance with various embodiments of the invention.

FIG. 8 depicts a full implementation of $I_{VGS}$ generation in accordance with various embodiments of the invention. The replica gate driver 810 adopts option 4 shown in FIG. 7 and is a replica gate driver of a main gate driver 910 (shown in FIG. 9). The gate driver 810 comprises a first series circuit having a bias resistor $R_B$ 802 to receive the current $I_{VGS}$ and a PLDMOS transistor 804 and a second series circuit having a NLDMOS transistor 806 and a bias current source $I_B$ 808. The NLDMOS transistor 806 has a gate terminal grounded and a source terminal coupled to a gate terminal of the PLDMOS transistor 804.

The calibration process is similar to the calibration described with respect to FIG. 5. The $I_{VGS}$ generator 800 operates in a low-voltage domain on a replica switch transistor 820 and the replica gate-driver 810. Therefore, the bandwidth of the $I_{VGS}$ generator does not limit the signal bandwidth and slew-rate of the main floating HV switch. Another benefit of this low-voltage domain calibration is a smaller silicon area and power consumption compared to high-voltage calibration in prior arts.

It shall be noted that although the replica switch transistor 820 is a single transistor, the $I_{VGS}$ generator 800 may also be used for impedance control of a floating bi-directional HV switch (e.g., the switch 900 shown in FIG. 9) containing two NLDMOS transistors as long as the two NLDMOS transistors ($NLD_{swa}$ and $NLD_{swb}$) and the element building their gate drivers are matched.

Figure 9:
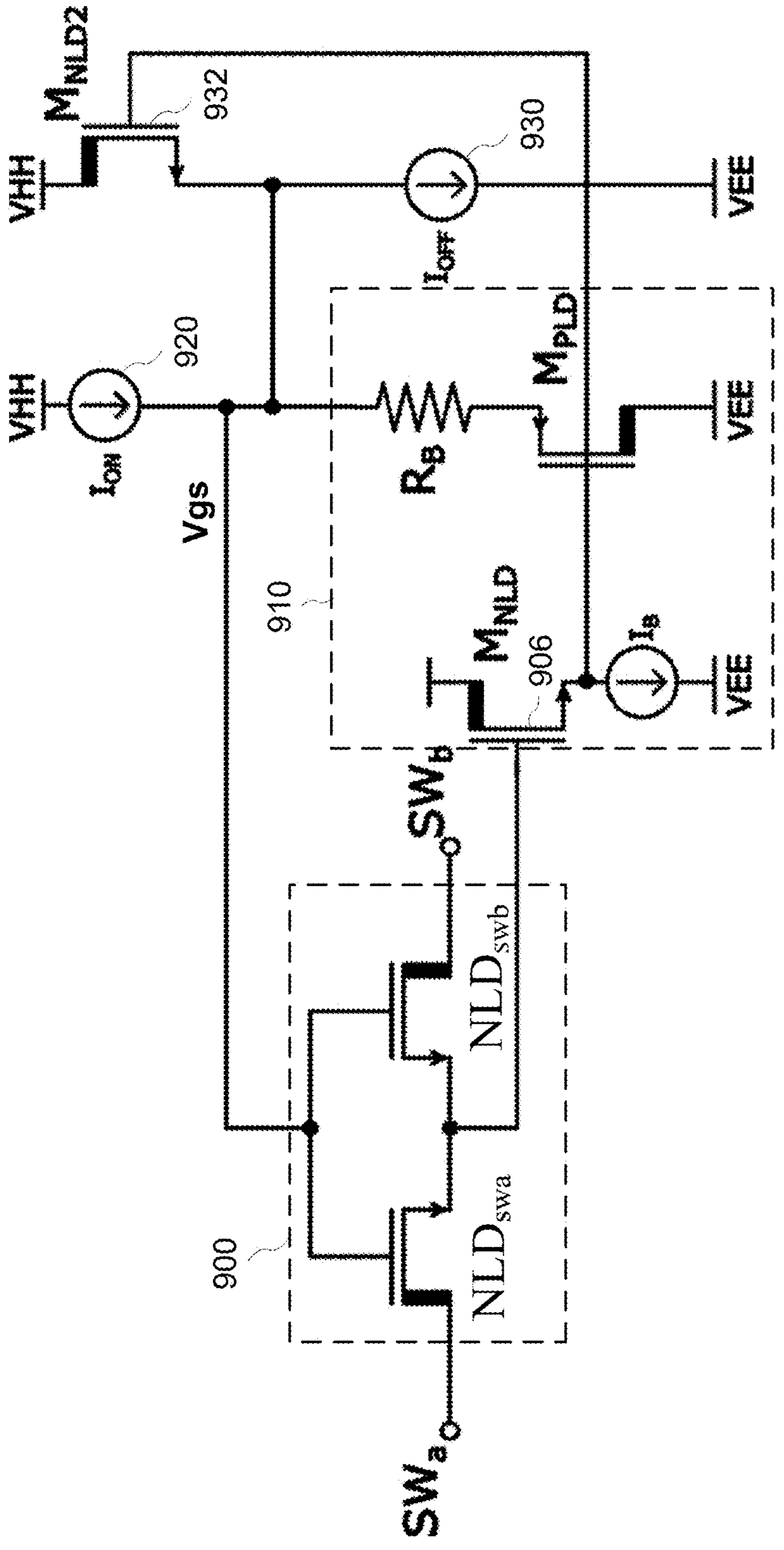
FIG. 9 depicts a full implementation of HV floating switch control in accordance with various embodiments of the invention.

FIG. 9 depicts a full implementation of HV floating switch control in accordance with various embodiments of the invention. The main gate driver 910, which matches the replica gate driver 810, is capable of outputting a desired voltage Vgs to turn on the main HV floating switch 900 while controlling the on impedance to have $R_{NLD}=R_{TFR}$. As shown in FIG. 9, the main gate driver 910 couples to a first bias current source 920 that outputs a current $I_{ON}$ toward the bias resistor $R_B$. A second NLDMOS transistor $M_{NLD2}$ 932 has a source terminal coupled to both the bias resistor $R_B$ and a second bias current source 930 that outputs a current $I_{OFF}$, and a gate terminal coupled to a source terminal of the first NLDMOS transistor $M_{NLD}$ 906.

The desired voltage Vgs may be applied to the HV floating switch 900 by adjusting the bias currents (i.e., $I_{ON}$ and $I_{OFF}$) of the main gate driver 910. When $I_{ON}=I_{VGS}$ and $I_{OFF}=0$, the switch 900 is turned on. When $I_{ON}=0$ and $I_{OFF}>0$, the switch 900 is turned off. The current $I_{OFF}$ may be adjusted based on other specs, e.g., off-leakage. The control of setting $I_{ON}$ as 0 or $I_{VGS}$ may be done at a low-voltage domain by current mirrors. Typically, when the switch 900 is tuned off, $I_{OFF}$ is set as equal to the gate driver bias current $I_B$ so that the switch Vgs is set equal to $-2\times Vgs_{MNLD}$. It shall be noted that the size of the gate driver and its bias current $I_B$ may be independently optimized for the speed and power requirement of the HV floating switch.

Simulation results for a floating HV switch comprising 205V NLDMOS devices show that Ron variation of the HV switch is within ±2.2%, which is a significant improvement compared to 50% Ron variation shown in FIG. 1. Additional simulation results under 10 Vpp 150 kHz 10V/μs slew-rate input signal show that the $V_{GS}$ of the floating switch transistors kept almost constant during fast input signals. These simulation results demonstrate the effectiveness of open-loop HV switch impedance controlling using a replica switch and a replica gate driver for $I_{VGS}$/Vgs calibration.

Figure 10:
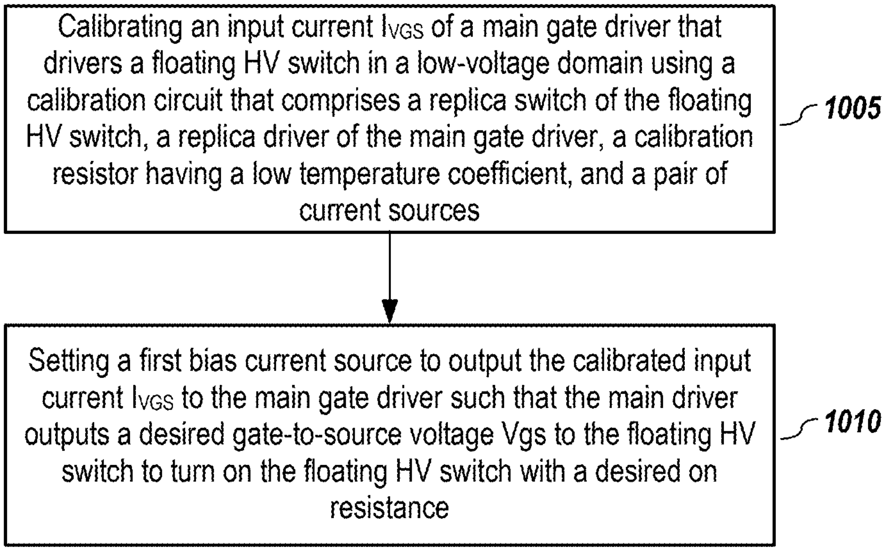
FIG. 10 depicts a process for controlling the impedance of a switch in accordance with various embodiments of the present disclosure.

FIG. 10 depicts a process for controlling the impedance of a switch in accordance with various embodiments of the present disclosure. The process begins at step 1002, in which an input current $I_{VGS}$ of a main driver that drives a floating HV switch is calibrated in a low-voltage domain using a calibration circuit that comprises a replica switch of the floating HV switch, a replica gate driver of the main driver, a calibration resistor having a low temperature coefficient, and a pair of current sources.

In step 1010, a first bias current source is set to output a current $I_{ON}$ the same as the calibrated input current to the main driver, such that the main driver outputs a desired gate-to-source voltage Vgs to the floating HV switch to turn on the floating HV switch with a desired on resistance, which has the same resistance as the calibration resistor. The output current $I_{ON}$ of the first bias current source may also be set to 0 to turn off the floating HV switch. The control logic of the turning ON/OFF the current sources are implemented in low-voltage domain.

It will be appreciated by those skilled in the art that the preceding examples and embodiments are exemplary and not limiting to the scope of the present disclosure. It is intended that all permutations, enhancements, equivalents, combinations, and improvements thereto that are apparent to those skilled in the art upon a reading of the specification and a study of the drawings are included within the true spirit and scope of the present disclosure. It shall also be noted that elements of any claims may be arranged differently, including having multiple dependencies, configurations, and combinations.

What is claimed is:

1. A method for switch impedance control, the method comprising:

calibrating an input current of a main gate driver that drives a floating high-voltage (HV) switch using an input current generator that comprises a calibration circuit and a replica gate driver of the main gate driver, the calibration circuit comprises a replica switch of the floating HV switch and a calibration resistor having a low temperature coefficient; and setting a first bias current source to output the calibrated input current to the main gate driver such that the main gate driver outputs a desired gate-to-source voltage (Vgs) to the floating HV switch to turn on the floating HV switch with a desired on-resistance.

2. The method of claim 1, wherein the calibration is performed in a low-voltage domain.

3. The method of claim 1, wherein the calibration resistor is a thin-film resistor (TFR).

4. The method of claim 1, wherein the input current generator further comprises:

a first operational amplifier (opamp) having a first input coupled to the calibration circuit, a second input coupled to the replica gate driver, and an output coupled back to the replica gate driver via a feedback transistor.

5. The method of claim 4, wherein the calibration circuit further comprises:

a first current source generating a first current flowing through the calibration resistor to create a voltage;

a second current source generating a second current flowing through the replica switch; and a second opamp having a first input coupled to the calibration resistor, a second input coupled to the replica switch, and an output coupled to the first input of the first opamp and also back to the gate terminal of the replica switch, the output of the second opamp is the desired Vgs.

6. The method of claim 1, wherein the main gate driver is a resistor having a low temperature coefficient; a resistor in series connection with a transistor; a diode in series connection with a transistor; or a circuit comprising a first series circuit having a resistor and a first transistor and a second series circuit having a second transistor and a bias current source, the second transistor has a gate terminal grounded and a source terminal coupled to a gate terminal of the first transistor.

7. The method of claim 1, wherein the first bias current source is configurable such that the first bias current source is able to output the calibrated input current to turn on the floating HV switch or to output a zero current to turn off the floating HV switch.

8. A system for switch impedance control, the system comprising:

a floating high-voltage (HV) switch;

a main gate driver that drives the floating high-voltage (HV) switch;

an input current generator for calibrating an input current of the main gate driver, the input current generator comprising:

a replica gate driver of the main gate driver; and a calibration circuit comprising a replica switch of the floating HV switch and a calibration resistor having a low temperature coefficient;

wherein the calibrated input current is applied to the main gate driver such that the main gate driver outputs a desired gate-to-source voltage (Vgs) to the floating HV switch to turn on the floating HV switch with a desired on-resistance.

9. The system of claim 8, wherein the calibration is performed in a low-voltage domain.

10. The system of claim 8, wherein the calibration resistor is a thin-film resistor (TFR).

11. The system of claim 8, wherein the main gate driver is a resistor having a low temperature coefficient; a resistor in series connection with a transistor; a diode in series connection with a transistor; or a circuit comprising a first series circuit having a resistor and a first transistor and a second series circuit having a second transistor and a bias current source, the second transistor has a gate terminal grounded and a source terminal coupled to a gate terminal of the first transistor.

12. The system of claim 8, wherein the input current generator further comprises:

a first operational amplifier (opamp) having a first input coupled to the calibration circuit, a second input coupled to the replica gate driver, and an output coupled back to the replica gate driver via a feedback transistor.

13. The system of claim 12, wherein the calibration circuit further comprises:

a first current source generating a first current flowing through the calibration resistor to create a voltage;

a second current source generating a second current flowing through the replica switch; and a second opamp having a first input coupled to the calibration resistor, a second input coupled to the replica switch, and an output couple to the first input of the first opamp and also back to the gate terminal of the replica switch, the output of the second opamp is the desired Vgs.

14. A current generator for switch impedance calibration, the current generator comprising:

a replica gate driver of a gate driver that drives a floating high-voltage (HV) switch, the replica gate driver receives an input current from a power supply via a feedback transistor;

a first operational amplifier (opamp) having an input coupled to the replica gate driver and an output coupled back to the replica gate driver via the feedback transistor; and a calibration circuit comprising:

a replica switch of the floating HV switch;

a calibration resistor having a low temperature coefficient; and a first current source generating a first current flowing through the calibration resistor to create a voltage;

a second current source generating a second current flowing through the replica switch; and a second opamp having a first input coupled to the calibration resistor, a second input coupled to the replica switch, and an output coupled to the first input of the first opamp and back to the gate terminal of the replica switch;

wherein the first opamp and the second opamp are operated to calibrate the input current of the replica gate driver such that the replica gate driver outputs a desired gate-to-source voltage (Vgs) to the replica switch to turn on the replica switch with an on resistance same as the calibration resistor.

15. The current generator of claim 14, wherein the calibration is performed in a low-voltage domain.

16. The current generator of claim 14, wherein the calibration resistor is a thin-film resistor (TFR).

17. The current generator of claim 14, wherein the first current source is adjustable such that the first current is the same as the second current.

18. The current generator of claim 14, wherein the replica gate driver is a resistor having a low temperature coefficient; a resistor in series connection with a transistor; a diode in series connection with a transistor; or a circuit comprising a first series circuit having a resistor and a first transistor and a second series circuit having a second transistor and a bias current source, the second transistor has a gate terminal grounded and a source terminal coupled to a gate terminal of the first transistor.

19. The current generator of claim 14, wherein the replica switch and the floating HV switch are unidirectional switches.

20. The current generator of claim 14, wherein the floating HV switch is a bidirectional switch comprising two matching transistors, the replica switch is a single transistor that replicates one of the two matching transistors.

* * * * *